US012696817B2

(12) United States Patent
  Ji

(10) Patent No.: US 12,696,817 B2
(45) Date of Patent: Jul. 28, 2026

(54) THREE-DIMENSIONAL STACK PACKAGE STRUCTURE WITH ADHESIVE LAYERS

(71) Applicant: ChangXin Memory Technologies, Inc., Hefei City (CN)

(72) Inventor: Hongkai Ji, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 342 days.

(21) Appl. No.: 18/547,152

(22) PCT Filed: Nov. 1, 2022

(86) PCT No.: PCT/CN2022/128970
  § 371 (c)(1),
  (2) Date: Aug. 18, 2023

(87) PCT Pub. No.: WO2024/031848
  PCT Pub. Date: Feb. 15, 2024

(65) Prior Publication Data
  US 2025/0006702 A1     Jan. 2, 2025

(30) Foreign Application Priority Data

Aug. 8, 2022    (CN) .......................... 202210944874.7

(51) Int. Cl.
  *H10W 90/00*         (2026.01)
  *H10W 70/04*         (2026.01)
  (Continued)
(52) U.S. Cl.
  CPC ........... *H10W 90/00* (2026.01); *H10W 70/04* (2026.01); *H10W 72/59* (2026.01);
  (Continued)

(58) Field of Classification Search
  CPC ... H01L 25/0657; H01L 25/065; H01L 25/07; H01L 25/105; H01L 25/072; H01L 24/04;
  (Continued)

(56) References Cited

U.S. PATENT DOCUMENTS

2002/0180057 A1* 12/2002 Lee .................. H04N 21/43637
                                                  257/777
2002/0190368 A1* 12/2002 Shimoe ................. H10W 90/00
                                                  257/E25.013
(Continued)

FOREIGN PATENT DOCUMENTS

CN          104779219 A      7/2015

OTHER PUBLICATIONS

PCT/CN2022/128970 International Search Report mailed Mar. 20, 2023.

*Primary Examiner* — Wael M Fahmy
*Assistant Examiner* — Tiberiu Dan Onuta
(74) *Attorney, Agent, or Firm* — Syncoda LLC; Feng Ma

(57) ABSTRACT

Disclosed three-dimensional stacked package structure includes: a packaging substrate, having a substrate body, connecting leads, a through-hole penetrating the substrate body, a first pad and a second pad on opposite surfaces of the substrate body. The stacked structure on the first surface of the substrate body includes a second storage block, and a first storage block above the second storage block; the connecting leads include a first lead and a second lead with equal lengths, the first lead is above the package substrate, and one end is electrically connected to the first pad, and the other end is electrically connected to the first storage block. The second lead passes through the through-hole, and one end is electrically connected to the second storage block, the other end is electrically connected to the second pad. The present disclosure reduces the crosstalk between signal (Continued)

lines, thereby reducing signal delay between different storage blocks.

14 Claims, 10 Drawing Sheets

(51) Int. Cl.

| | |
|---|---|
| *H10W 72/00* | (2026.01) |
| *H10W 72/59* | (2026.01) |
| *H10W 72/90* | (2026.01) |
| *H10W 74/10* | (2026.01) |
| *H10W 90/20* | (2026.01) |

(52) U.S. Cl.
CPC ........ *H10W 72/823* (2026.01); *H10W 72/865* (2026.01); *H10W 72/884* (2026.01); *H10W 72/953* (2026.01); *H10W 74/117* (2026.01); *H10W 90/20* (2026.01); *H10W 90/732* (2026.01); *H10W 90/734* (2026.01); *H10W 90/754* (2026.01); *H10W 90/792* (2026.01)

(58) Field of Classification Search
CPC ......... H01L 24/05; H01L 24/08; H01L 24/32; H01L 24/48; H01L 24/73; H01L 21/4821; H01L 21/56; H01L 21/48; H01L 23/3128; H01L 23/31; H01L 23/48; H01L 23/492; H01L 23/52; H01L 23/481; H01L 2224/04042; H01L 2224/05687; H01L 2224/08145; H01L 2224/32145; H01L 2224/32225; H01L 2224/48225; H01L 2224/73215; H01L 2224/73265; H01L 2225/0651; H01L 2225/06548; H01L 2225/06555; H01L 2225/06513; H01L 2225/06517; H01L 2225/06541; H01L 2225/06562; H01L 2924/1436
See application file for complete search history.

(56) References Cited

U.S. PATENT DOCUMENTS

| | | | |
|---|---|---|---|
| 2004/0016999 A1* | 1/2004 | Misumi ................. | H10W 90/00 257/E25.011 |
| 2006/0284298 A1 | 12/2006 | Kim et al. | |
| 2011/0291295 A1* | 12/2011 | Isa ........................... | H01L 23/13 257/777 |
| 2011/0298097 A1* | 12/2011 | Sueyoshi ................ | H01L 25/50 257/E29.112 |
| 2015/0200186 A1* | 7/2015 | Park ...................... | H01L 23/562 257/734 |

* cited by examiner

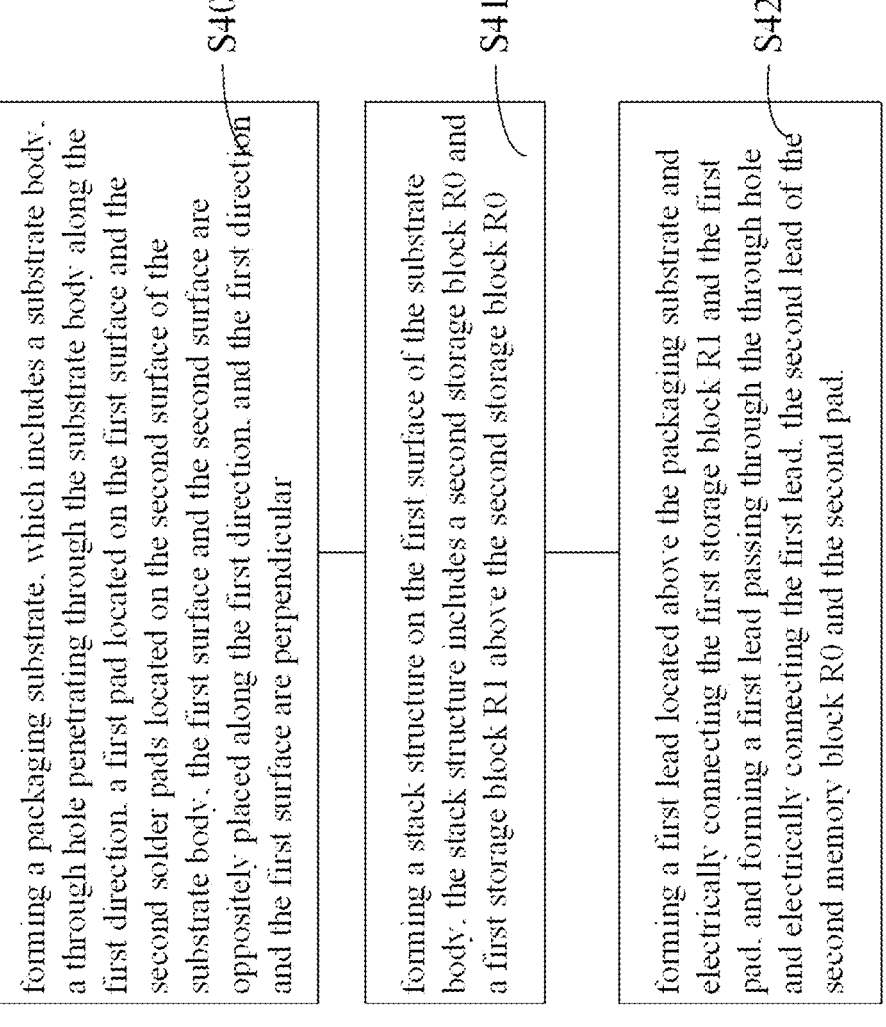

forming a packaging substrate, which includes a substrate body, a through hole penetrating through the substrate body along the first direction, a first pad located on the first surface and the second solder pads located on the second surface of the substrate body, the first surface and the second surface are oppositely placed along the first direction, and the first direction and the first surface are perpendicular — S40 forming a stack structure on the first surface of the substrate body, the stack structure includes a second storage block R0 and a first storage block R1 above the second storage block R0 — S41 forming a first lead located above the packaging substrate and electrically connecting the first storage block R1 and the first pad, and forming a first lead passing through the through hole and electrically connecting the first lead, the second lead of the second memory block R0 and the second pad. — S42

THREE-DIMENSIONAL STACK PACKAGE STRUCTURE WITH ADHESIVE LAYERS

CROSS REFERENCES TO RELATED APPLICATIONS

This application claims the benefit of priority of Chinese patent application with the application number 202210944874.7 filed on Aug. 8, 2022, entitled "Three-dimensional Stack Package Structure And Method Making The Same", the contents of which are incorporated herein by reference in its entirety.

TECHNICAL FIELD

The present disclosure relates to the technical field of semiconductor manufacturing, in particular to a three-dimensional stacked package structure and its forming method.

BACKGROUND

In semiconductor products such as Low Power Double Data Rate (LPDDR) memory, multiple storage blocks (Rank) are stacked sequentially on the packaging substrate, and the packaging substrate is provided with welding pads. The blocks are connected to the welding pads on the packaging substrate through connecting wires, and external control signals are transmitted to the storage blocks through the welding pads and the connecting wires. However, due to the different heights of the storage blocks and different distances between storage blocks and the packaging substrate, resulting in different lengths of connecting lines between different storage blocks and the packaging substrate, leading to their storage blocks signal delays etc. In order to solve this problem, wiring can be performed inside the storage block or inside the packaging substrate. However, the internal wiring of the storage blocks will increase the volume of the storage block, increase occupied space of the semiconductor product, thus reduces the space utilization rate of the semiconductor product, and also easily causes signal crosstalk. In addition, internal wiring of the packaging substrate will increase the complexity of the internal circuit of the packaging substrate, increase the size of the packaging substrate, and cause signal crosstalk easily to occur inside the packaging substrate.

Therefore, how to reduce the signal delay between different storage blocks and at the same time reduce the crosstalk between the signal lines, so as to improve the performance and yield of the package structure, is a technical problem to be solved urgently.

SUMMARY

Some embodiments of the present disclosure provide a three-dimensional stack package structure and a forming method thereof, which are used to reduce signal delays between different storage blocks and reduce crosstalk between signal lines, thereby improving the performance and yield of the package structure.

According to some embodiments, the present disclosure provides a three-dimensional stack package structure, including:

the packaging substrate which includes a substrate body, a through-hole penetrating through the substrate body along a first direction, a first pad on the first surface of the substrate body, and a second pad on the second surface of the substrate body. Welding pads, the first surface and the second surface are relatively distributed along the first direction, and the first direction is perpendicular to the first surface;

a stacked structure which is located on the first surface of the substrate body, the stacked structure has a second storage block and a first storage block located above the second storage block;

connecting leads, which include a first lead and a second lead with equal lengths, the first lead is located above the package substrate, and one end of the first lead is electrically connected to the first pad, and the other end is electrically connected to the first storage block, the second lead passes through the through-hole, and one end of the second lead is electrically connected to the second pad, and the other end is electrically connected to the second storage block.

In some embodiments, the thickness of the stacked structure along the first direction is equal to the thickness of the substrate body along the first direction.

In some embodiments, the package substrate also includes:

a third pad located on the second surface;

a connection column located in the substrate body, one end of the connection column is electrically connected to the first welding pad, and the other end is electrically connected to the third welding pad.

In some embodiments, the first storage block includes:

a plurality of storage chips, a plurality of storage chips are stacked along the first direction, and adjacent storage chips are electrically connected, and the first lead is connected to the topmost storage device in the first storage block and the chips are electrically connected.

In some embodiments, the first storage block includes a first storage chip and a second storage chip located above the first storage chip along a first direction, and the top surface of the first storage chip is in contact with the first storage chip via a top surface bonding connection of the second storage chip;

The bottom surface of the second storage chip is electrically connected to the first lead.

In some embodiments, the top surface of the first storage chip has a first bonding pad, the top surface of the second storage chip has a second bonding pad, and the first bonding pad is connected to the second bonding pad via bonding pad electrical connection;

The second storage chip further includes a first bonding pad located on the bottom surface of the second storage chip, and a first signal plug penetrating through the second storage chip along the first direction, One end of the first signal plug is electrically connected to the second bonding pad, the other end is electrically connected to the first bonding pad, and the first lead is electrically connected to the first bonding pad.

In some embodiments, the first storage chip further includes:

a first conductive solder pad, located on the surface of the first bonding pad away from the first signal plug, and the first conductive solder pad is bonded to the second bonding pad.

In some embodiments, the first storage block also includes:

a first bonding layer filling the gap between the first storage chip and the second storage chip for bonding the first storage chip and the second storage chip.

In some embodiments, the stacked structure also includes:

a second adhesive layer located between the second storage block and the packaging substrate, and the second adhesive layer includes a groove penetrating the second adhesive layer along the first direction, so the groove is aligned with the through-hole along the first direction, and the second lead passes through the groove and the through-hole.

In some embodiments, the second storage block includes:

a plurality of storage chips, a plurality of storage chips are stacked along the first direction, and the adjacent storage chips are electrically connected, and the second lead is connected to the storage chip at the bottom of the second storage block. The chip is electrically connected.

In some embodiments, the second storage block includes a third storage chip and a fourth storage chip located above the third storage chip along the first direction, the top surface of the third storage chip is in contact with the a top surface bonding connection of the fourth storage chip;

The bottom surface of the third storage chip is electrically connected to the second lead.

In some embodiments, the top surface of the third storage chip has a third bonding pad, the top surface of the fourth storage chip has a fourth bonding pad, and the third bonding pad is connected to the fourth bonding pad. Bonding pad bonding electrical connections;

The third storage chip further includes a second bonding pad located on the bottom surface of the third storage chip, and a second signal plug penetrating through the third storage chip along the first direction, the second signal plug One end of the plug is electrically connected to the third bonding pad, the other end is electrically connected to the second bonding pad, the second lead is electrically connected to the second bonding pad, and at least one of the second bonding pads is connected to the second bonding pad. The through-holes are aligned along the first direction.

According to some other embodiments, the present disclosure also provides a method for forming a three-dimensional stack package structure, including the following steps:

forming a packaging substrate, the packaging substrate includes a substrate body, a through-hole penetrating through the substrate body in a first direction, a first pad on the first surface of the substrate body, and a second pad on the substrate body second pads on the surface, the first surface and the second surface are oppositely distributed along the first direction, and the first direction is perpendicular to the first surface;

forming a stacked structure on the first surface of the substrate body, the stacked structure including a second storage block and a first storage block above the second storage block;

forming a first lead on the packaging substrate and electrically connecting the first storage block and the first pad, and forming a lead through the through-hole and electrically connecting the second storage block and the second lead of the second pad.

In some embodiments, the specific steps of forming the packaging substrate include:

arranging a preset thickness of the stacked structure;

forming a substrate body such that the thickness of the substrate body along the first direction is equal to the preset thickness; and forming the first pad on the first surface of the substrate body, the second and third pads on the second surface of the substrate body, and the connection column in the substrate body and electrically connects the first welding pad and the third welding pad.

In some embodiments, the specific steps of forming a stacked structure on the first surface of the substrate body include:

forming a first storage block, the first storage block including a plurality of storage chips stacked along the first direction, and adjacent storage chips in the first storage block are electrically connected;

forming a second storage block, the second storage block is a plurality of storage chips stacked along the first direction, and adjacent storage chips in the first storage block are electrically connected;

fixing the second storage block on the first surface of the substrate body, and fixing the first storage block above the second storage block along the first direction.

In some embodiments, the specific steps of forming the first storage block include:

forming a first storage chip and a second storage chip, the top surface of the first storage chip has a first bonding pad, the top surface of the second storage chip has a second bonding pad, and the second storage chip also including a first bonding pad located on the bottom surface of the second storage chip, and a first signal plug penetrating through the second storage chip along the first direction, one end of the first signal plug is electrically connected to the other end of the second bonding pad is electrically connected to the first bonding pad;

bonding the first storage chip and the second storage chip in such a manner that the first bonding pad and the second bonding pad face each other.

In some embodiments, the second storage chip further includes a first conductive solder pad located on the surface of the second bonding pad away from the first signal plug. The specific steps of bonding the first storage chip and the second storage chip in such a way that the second bonding pads are opposite include:

bonding the first conductive solder pad and the first bonding pad;

forming a first adhesive layer to fill a gap between the first storage chip and the second storage chip.

In some embodiments, the specific steps of forming the second storage block include:

forming a third storage chip and a fourth storage chip, the top surface of the third storage chip has a third bonding pad, the top surface of the fourth storage chip has a fourth bonding pad, and the third storage chip further including a second bonding pad located on the bottom surface of the third storage chip, and a second signal plug penetrating through the third storage chip along the first direction, one end of the second signal plug is electrically connected to the third bonding pad, the other end of which is electrically connected to the second bonding pad;

The third storage chip and the fourth storage chip are bonded in such a manner that the third bonding pad and the fourth bonding pad face each other.

In some embodiments, the second storage block is fixed on the first surface of the substrate body, and the first storage block is fixed on the second storage block along the first direction. The specific steps above include:

a third storage chip in the second storage block is bonded to the first surface of the substrate body through a second adhesive layer, and the second adhesive layer has a direction along the first direction, a groove penetrating through the second adhesive layer and aligned with the through-hole along the first direction, at least one of the second bonding pads aligned with the through-hole along the first direction;

the first storage chip and the fourth storage chip in the first storage block are bonded by a third bonding layer.

In some embodiments, a first lead is formed above the packaging substrate and electrically connected to the first storage block and the first pad, and formed to pass through the through-hole and electrically connect to the second lead. The specific steps of storing the block and the second lead of the second pad include:

forming the first lead that is located above the package substrate and electrically connects the first bonding pad and the first solder pad;

forming a second lead passing through the through-hole and the trench and electrically connecting the second bonding pad and the second pad.

Some embodiments of the present disclosure provide a three-dimensional stack package structure and a method for forming the same. By forming a through-hole penetrating through the packaging substrate along the first direction inside the packaging substrate, the second storage block on the packaging substrate passes through the through-hole. The second lead of the hole is electrically connected to the packaging substrate, and the first storage block located above the second storage block is electrically connected to the packaging substrate through the first lead located above the packaging substrate, so that there is no need to pass through Winding wires inside the first storage block, the second storage block or the packaging substrate can realize that the length of the first lead wire is equal to the length of the second lead wire, thereby reducing the signal between different storage blocks While delaying, it reduces the crosstalk between signal lines such as leads, thereby improving the yield and performance of the three-dimensional stacked package structure, and will not increase the complexity of the internal circuits of the three-dimensional stacked package structure, thereby helping to control the described The cost of the three-dimensional stack package structure.

BRIEF DESCRIPTION OF THE DRAWINGS

FIG. 3 is a flowchart of the method forming the three-dimensional stacked package structure according to one embodiment of the present disclosure.

DETAILED DESCRIPTION OF THE PREFERRED EMBODIMENTS

The specific implementation manners of the three-dimensional stack package structure and its forming method provided by the present disclosure will be described in detail below with reference to the accompanying drawings.

Figure 1:
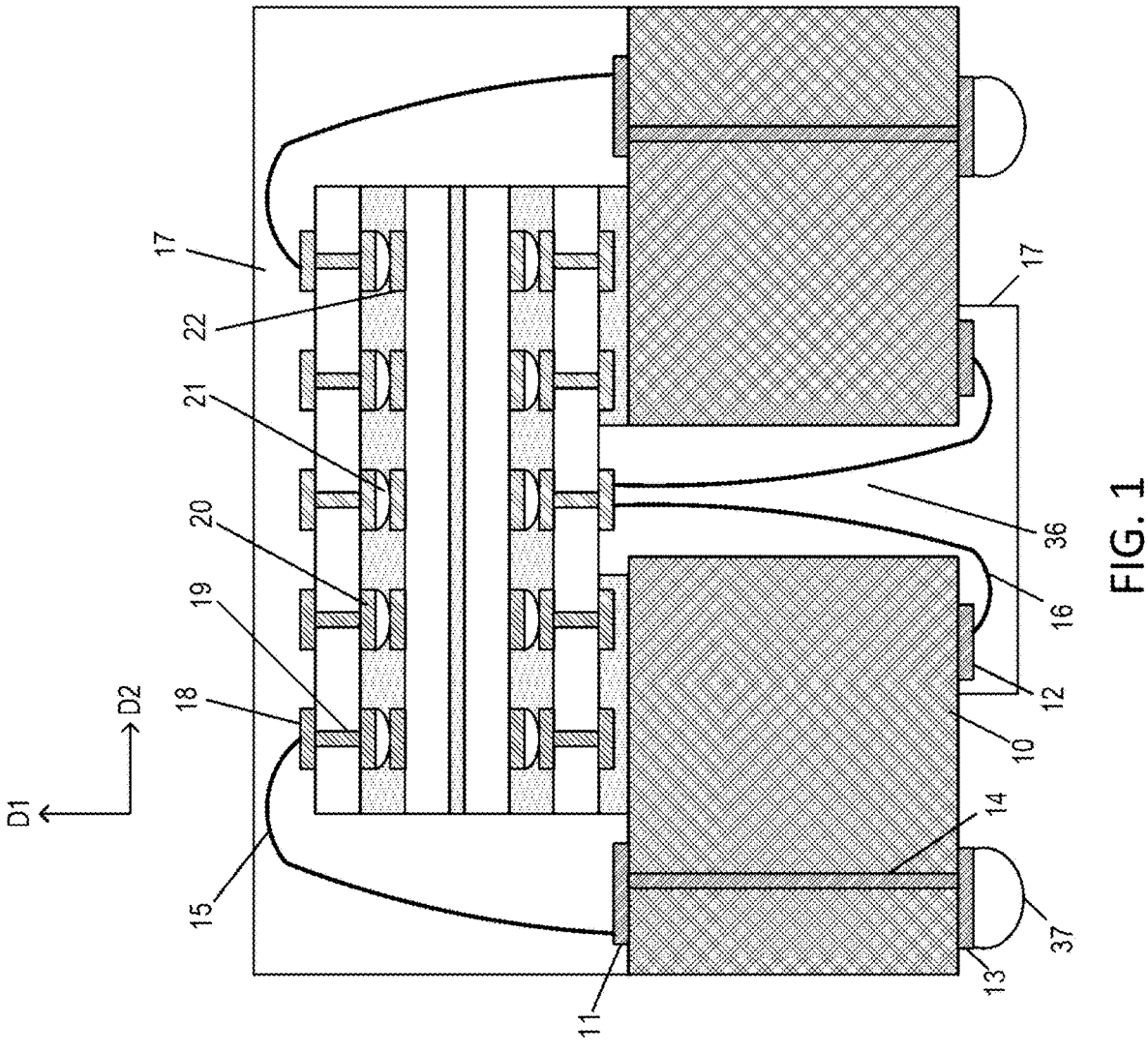
FIG. 1 is a schematic diagram of a three-dimensional stacked package structure according to an embodiment of the present disclosure.
Figure 2:
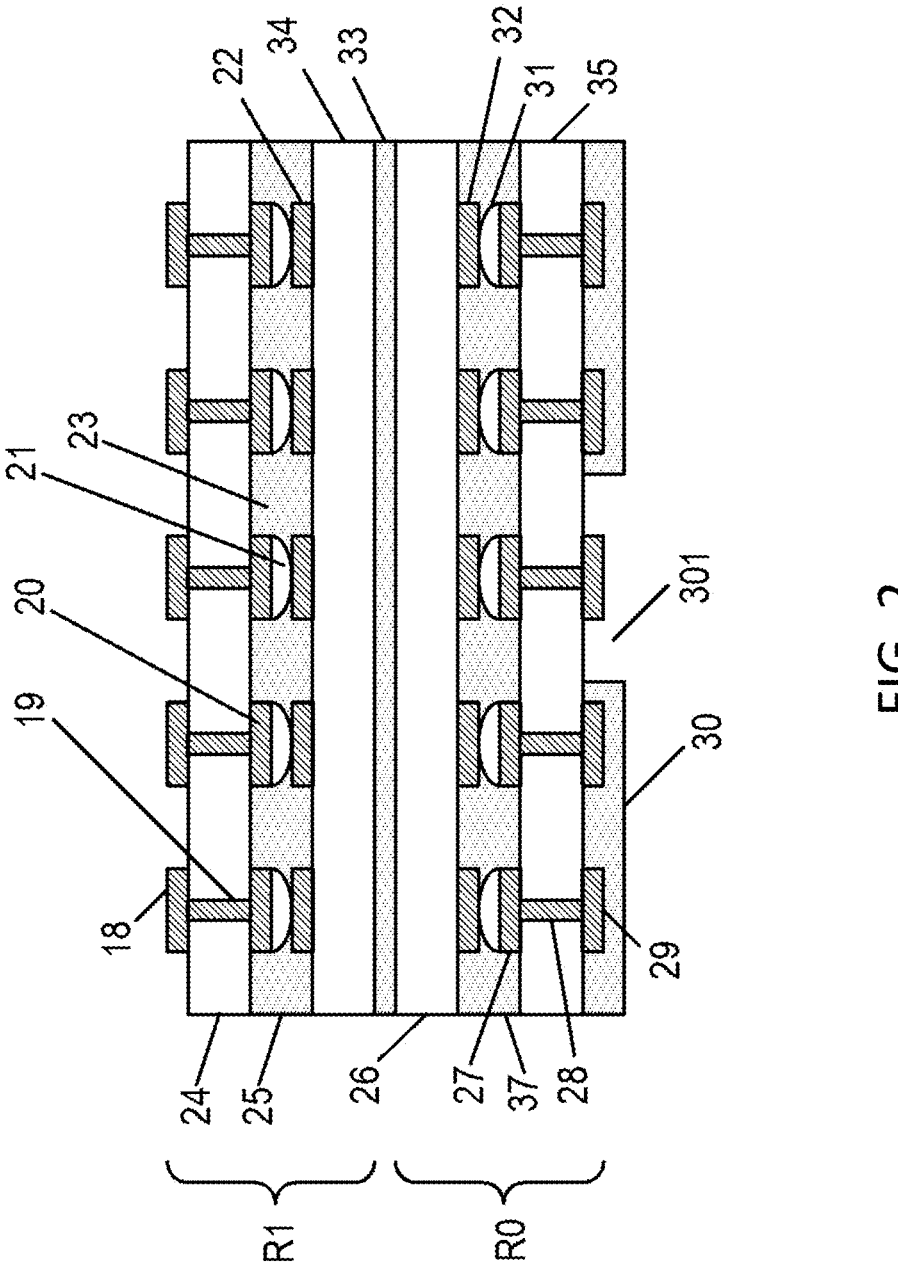
FIG. 2 is a schematic diagram of a stacked package structure according to one embodiment of the present disclosure.

The present disclosure provides a three-dimensional stacked package structure. FIG. 1 is a schematic diagram of a three-dimensional stacked package structure according to an embodiment of the present disclosure, and FIG. 2 is a schematic diagram of a stacked structure according to an embodiment of the present disclosure. As shown in FIGS. 1 and 2, the three-dimensional stack package structure includes:

a packaging substrate with a substrate body 10, a through-hole 36 penetrating through the substrate body 10 along a first direction D1, a first pad 11 located on the first surface of the substrate body 10, and a solder pad 11 located on the substrate body 10. The second pad 12 on the second surface, the first surface and the second surface are relatively distributed along the first direction D1, and the first direction D1 is perpendicular to the first surface;

a stacked structure located on the first surface of the substrate body 10, the stacked structure includes a second storage block R0 and a first storage block R1 above the second storage block R0;

connecting leads, including a first lead 15 and a second lead 16 of equal length, the first lead 15 is located above the package substrate, and one end of the first lead 15 is electrically connected to the first pad 11, the other One end is electrically connected to the first storage block R1, the second lead 16 passes through the through-hole 36, and one end of the second lead 16 is electrically connected to the second pad 12, and the other end is electrically connected to the second storage block R0.

The three-dimensional stack package structure described in this embodiment may be but not limited to LPDDR. Specifically, the package substrate may be, but not limited to, a printed circuit board (PCB). The packaging substrate has the through-hole 36 penetrating through the substrate body 10 along the first direction D1, and the two opposite surfaces of the substrate body 10 along the first direction D1 are respectively provided with the first welding pad 11 and the second welding pad 12. The stacked structure is located on the first surface of the substrate body 10, and the stacked structure covers the through-hole 36. Both the first storage block R1 and the second storage block R0 in the stacked structure include a plurality of storage chips. In an example, the multiple storage chips in the first storage block R1 are of the same type as the multiple storage chips in the second storage block R0, for example, both are Dynamic Random Access Memory (DRAM) chips. The multiple mentioned in this embodiment refers to two or more. The second storage block R0 and the first storage block R1 in the stacked structure are stacked along the first direction D1, and the first storage block R1 is located in the second storage block R0 Above, that is, along the first direction D1, the distance between the first storage block R1 and the packaging substrate is greater than the distance between the second storage block R0 and the packaging substrate.

The connection leads are used to electrically connect the packaging substrate and the stacked structure, so as to transmit control signals from the outside to the first storage block R1 and the stacked structure in the stacked structure through the packaging substrate. The second storage block R0. The connecting leads include the first lead 15 and the second lead 16. Wherein, the first lead 15 electrically connecting the first storage block R1 and the first pad 11 is located above the package substrate, and electrically connects the second storage block R0 and the second pad 11. The second lead 16 of the pad 12 is electrically connected to the second pad 12 through the through-hole 36. By providing the through-hole 36 in the package substrate and allowing the second lead 16 to pass through the through-hole 36, the equal length of the first lead 15 and the second lead 16 can be realized, There is no need to carry out wiring design in the first storage block R1 and the second storage block R2, and it is not necessary to carry out a winding design in the wiring layer inside the packaging substrate. While the signal delay between the block R1 and the second storage block R0 can also simplify the circuit design inside the first storage block R1, the second storage block R0, and the packaging substrate, The crosstalk between the signal lines is reduced, thereby improving the yield and performance of the three-dimensional stacked package structure, without increasing the complexity of internal circuits of the three-dimensional stacked package structure, thereby helping to control the cost of the three-dimensional stacked package structure.

In some embodiments, the three-dimensional stack package structure further includes a plastic encapsulation layer 17, the plastic encapsulation layer 17 covers at least the stacked structure, the first lead 15 and the second lead 16, and the plastic encapsulation layer 17 to fill the through-holes 36 to prevent external factors from affecting the stacked structure, the first leads 15 and the second leads 16. In an example, the material of the plastic sealing layer 17 may be a resin material.

Those skilled in the art can adjust the diameter of the through-hole 36 according to actual needs, as long as the second lead wire 16 can pass through the through-hole 36, which is not limited in this embodiment. Those skilled in the art can adjust the thickness of the substrate body 10 along the first direction D1, the position and thickness of the first welding pad 11 on the first surface, and the position and thickness of the second welding pad 12 on the first surface. The position and thickness on the second surface, the height of the stacked structure along the first direction D1 and other factors are used to further adjust the lengths of the first lead 15 and the second lead 16, as long as the first length of the first lead wire 15 and the second lead wire 16 should be equal. In an example, the material of the first lead 15 and the second lead 16 are the same, and the diameter of the first lead 15 and the diameter of the second lead 16 are the same, thereby further reducing the first signal delay between the storage block R1 and the second storage block R0.

In some embodiments, the thickness of the stacked structure along the first direction D1 is equal to the thickness of the substrate body 10 along the first direction D1.

Specifically, since the first lead 15 is located on the upper part of the package substrate and connects the first pad 11 and the first storage block R1, the length of the first lead 15 mainly depends on The thickness of the stacked structure along the first direction D1. Since the second lead 16 passes through the through-hole 36 of the substrate body 10 and connects the second pad 12 and the second storage block R0, the second lead 16 The length mainly depends on the thickness of the substrate body 10 along the first direction D1. In this embodiment, the thickness of the substrate body 10 along the first direction D1 is set to be equal to the thickness of the stacked structure along the first direction D1, so that the first lead can be implemented more easily. The length of 15 is equal to the length of the second lead 16, which simplifies the manufacturing process of the three-dimensional stack package structure. For example, the thickness of the stacked structure along the first direction D1 and the thickness of the substrate body 10 along the first direction D1 are both 300 µm.

In some embodiments, the package substrate also includes:

a third pad 13 which is located on the second surface; and
a connection post 14 which is located in the substrate body 10, one end of the connection post 14 is electrically connected to the first pad 11, and the other end is electrically connected to the third pad 13.

Specifically, by arranging the connecting column 14 penetrating through the substrate body 10 along the first direction D1 in the substrate body 10, the first pad 11 is electrically connected to the first pad 11 through the connecting column 14. The third pad 13, the external control signal is transmitted to the first storage block R1 through the third pad 13, the connecting column 14, the first pad 11 and the first lead 15. Wherein, the materials of the first welding pad 11, the second welding pad 12, the third welding pad 13 and the connecting column 14 may be the same, for example, they are all conductive materials such as metal tungsten or metal copper. In an example, solder balls 37 (such as tin solder balls) are further provided on the surface of the third pad 13.

In order to further simplify the circuit of the three-dimensional stack package structure and reduce the signal delay between the storage chips inside the first storage block R1, in some embodiments, the first storage block R1 includes:

a plurality of storage chips, the plurality of storage chips are stacked along the first direction D1, and the adjacent storage chips are electrically connected, the first lead 15 is connected to the topmost layer of the first storage block R1. The storage chips are electrically connected.

In some embodiments, the first storage area R1 block includes a first storage chip 34 and a second storage chip 24 located above the first storage chip 34 along the first direction D1, and the first storage chip 34 The top surface (front side) of the second storage chip 24 is bonded to the top surface (front side);

The bottom surface (back surface) of the second storage chip 24 is electrically connected to the first lead 15.

In some embodiments, the top surface of the first storage chip 34 has a first bonding pad 22, the top surface of the second storage chip 24 has a second bonding pad 20, and the first bonding pad 22 electrically connected to the second bonding pad 20.

The second storage chip 24 further includes a first connecting pad 18 located on the bottom surface of the second storage chip 24, and a first signal plug 19 penetrating through the second storage chip 24 along the first direction D1, One end of the first signal plug 19 is electrically connected to the second bonding pad 20, the other end is electrically connected to the first connecting pad 18, and the first lead 15 is electrically connected to the first connecting pad 18.

In some embodiments, the first storage chip R1 further includes:

a first conductive solder pad 21 which is located on the surface of the first bonding pad 22 away from the first signal plug 19, and the first conductive solder pad 21 is bonded to the second bonding pad 20.

Specifically, the first storage chip 34 includes a top surface and a bottom surface that are relatively distributed along the first direction D1, and the second storage chip 24 also includes a top surface and a bottom surface that are relatively distributed along the first direction D1. The second storage chip 24 and the first storage chip 34 are bonded in a face-to-face manner, that is, the first conductive solder pad 21 on the top surface of the second storage chip 24 is bonded to the first storage chip 34. The first bonding pad 22 on the top surface is bonded and connected, and the first lead 15 is directly contacted and electrically connected to the first connecting pad 18 on the bottom surface of the second storage chip 24. The first control signal from the outside is transmitted to the first connecting pad 18 on the bottom surface of the second storage chip 24 through the first bonding pad 11 and the first lead 15. Afterwards, the first control signal is transmitted to the semiconductor structure on the top surface of the second storage chip 24 through the first connecting pad 18, the first signal plug 19 and the second bonding pad 20. The first control signal also passes through the first connecting pad 18, the first signal plug 19, the second bond pad 20, the first conductive solder pad 21 and the first bond The pad 22 is transferred to the semiconductor structure on the top surface of the first storage chip 34, thereby reducing the distance between the first storage chip 34 and the second storage chip 24 inside the first storage block R1. The signal delay improves the electrical performance of the first storage block R1 and the three-dimensional stack package structure.

In an example, the number of the first bonding pads 22 is multiple, and the multiple first bonding pads 22 are arranged at intervals along the second direction D2. The number of the second bonding pads 20 is also multiple, and the multiple second bonding pads 20 are electrically connected to the multiple first bonding pads 22 in one-to-one correspondence. The second direction D2 is parallel to the first surface.

In order to enhance the connection strength between the first storage chip 34 and the second storage chip 24 in the first storage block R1, while avoiding the connection between the first storage chip 34 and the second storage chip 24 The influence of residual air and other gases on the first bonding pad 22, the second bonding pad 20 and the first conductive solder pad 21, in some embodiments, the first storage block R1 also includes:

The first bonding layer 25 fills the gap between the first storage chip 34 and the second storage chip 24 and is used for bonding the first storage chip 34 and the second storage chip 24. In an example, the material of the first adhesive layer 25 may be underfill.

In some embodiments, the stacked structure also includes:

The second adhesive layer 30 is located between the second storage block R0 and the packaging substrate, and the second adhesive layer 30 includes a second adhesive layer that penetrates the second adhesive layer 30 along the first direction D1. The groove 301 is aligned with the through-hole 36 along the first direction D1, and the second lead 16 passes through the groove 301 and the through-hole 36.

Specifically, the second storage block R0 is fixed on the first surface of the substrate body 10 through the second adhesive layer 30, so as to strengthen the connection between the second storage block R0 and the packaging substrate. connection stability. The first storage region R1 can be fixed above the second storage block R0 through a third adhesive layer 33 to enhance the connection between the first storage block R1 and the second storage block R0 stability. In an example, the material of the second adhesive layer 30 is the same as that of the third adhesive layer 33, for example, both are insulating adhesive materials. In an example, the material of the second adhesive layer 30 and the material of the third adhesive layer 33 are both die attach film (Die Attach Film, DAF). The second bonding layer 30 is provided with the groove 301 aligned with the through-hole 36, so that the second lead 16 can pass through the bottom of the second storage block R0 sequentially. The trench 301 and the through-hole 36 are then electrically connected to the second pad 12.

In some embodiments, the second adhesive layer 30 is in contact with the second contact pad 29, and the third adhesive layer 33 is in contact with the backside of the storage chip, so that the second adhesive layer 30 will contact more heat, thereby The thermal expansion coefficient of the second adhesive layer 30 can be made smaller than the thermal expansion coefficient of the third adhesive layer 33, because the thermal expansion coefficient of the second adhesive layer 30 is relatively small, thereby reducing the thermal expansion difference between the storage chip and the substrate. In some embodiments, for example, increasing the concentration of silica in the second adhesive layer 30, the linear expansion coefficient of the silica filler is smaller, thereby increasing the thermal expansion coefficient of the second adhesive layer 30.

In order to further simplify the circuit of the three-dimensional stack package structure and reduce the signal delay between the storage chips inside the second storage block R0, in some embodiments, the second storage block R0 includes:

A plurality of storage chips, a plurality of storage chips are stacked along the first direction D1, and the adjacent storage chips are electrically connected, the second lead 16 is connected to the bottommost part of the second storage block R0 The storage chips are electrically connected.

In some embodiments, the second storage block R0 includes a third storage chip 35 and a fourth storage chip 26 located above the third storage chip 35 along the first direction D1, the third storage chip 35 The top surface of the top surface is bonded to the top surface of the fourth storage chip 26;

The bottom surface of the third storage chip 35 is electrically connected to the second lead 16.

In some embodiments, the top surface of the third storage chip 35 has a third bonding pad 27, the top surface of the fourth storage chip 26 has a fourth bonding pad 32, and the third bonding pad 27 Bonding and electrically connecting with the fourth bonding pad 32;

The third storage chip 35 further includes a second bonding pad 29 located on the bottom surface of the third storage chip 35, and a second signal plug 28 penetrating through the third storage chip 35 along the first direction D1, One end of the second signal plug 28 is electrically connected to the third bonding pad 27, the other end is electrically connected to the second bonding pad 29, the second lead 16 is electrically connected to the second bonding pad 29, and At least one of the second bonding pads 29 is aligned with the through-hole 36 along the first direction D1.

Specifically, the third storage chip 35 includes a top surface and a bottom surface that are relatively distributed along the first direction D1, and the fourth storage chip 26 also includes a top surface and a bottom surface that are relatively distributed along the first direction D1. The top surface of the third storage chip 35 includes a third bonding pad 27 and a second conductive solder pad 31 located on the surface of the third bonding pad 27. The third storage chip 35 is bonded to the fourth storage chip 26 in a face-to-face manner, that is, the second conductive solder pad 31 on the top surface of the third storage chip 35 is bonded to the fourth storage chip 26. The fourth bonding pad 32 on the top surface is bonded and connected, and the second lead 16 passing through the through-hole 36 and the groove 301 is connected to the first lead 16 on the bottom surface of the third storage chip 35. Two bonding pads 29 directly contact the electrical connection.

The second control signal from the outside is transmitted to the second bonding pad 29 on the bottom surface of the third storage chip 35 through the second bonding pad 12 and the second lead 16. Afterwards, the second control signal is transmitted to the semiconductor structure on the top surface of the third storage chip 35 through the second bonding pad 29, the second signal plug 28 and the third bonding pad 27. The second control signal also passes through the second bonding pad 29, the second signal plug 28, the third bond pad 27, the second conductive solder pad 31 and the fourth bond The pad 32 is transferred to the semiconductor structure on the top surface of the fourth storage chip 26, thereby reducing the distance between the third storage chip 35 and the fourth storage chip 26 inside the second storage block R0. The signal delay improves the electrical performance of the second storage block R0 and the three-dimensional stack package structure.

In order to enhance the connection strength between the third storage chip 35 and the fourth storage chip 26 in the second storage block R0 and avoid the connection between the third storage chip 35 and the fourth storage chip 26 The influence of residual air and other gases on the third bonding pad 37, the fourth bonding pad 32 and the second conductive solder pad 31, in some embodiments, the second storage block R0 also includes:

The fourth adhesive layer 37 fills the gap between the third storage chip 35 and the fourth storage chip 26 and is used for bonding the third storage chip 35 and the fourth storage chip 26. In an example, the material of the fourth adhesive layer 37 may be underfill.

This embodiment also provides a method for forming a three-dimensional stacked package structure. FIG. 3 is a flow chart of the method for forming a three-dimensional stacked package structure in an embodiment of the present disclosure. FIGS. 4 to 10 are embodiments of the present disclosure. Schematic diagram of the main process structure in the process of forming a three-dimensional stacked package structure. The schematic diagrams of the three-dimensional stack package structure formed in this embodiment can be referred to FIG. 1 and FIG. 2. As shown in FIGS. 1-10, the method for forming the three-dimensional stacked package structure includes the following steps:

Step S40, forming a packaging substrate, which includes a substrate body 10, a through-hole 36 penetrating through the substrate body 10 along the first direction D1, a first pad 11 located on the first surface and the second solder pads 12 located on the second surface of the substrate body 10, the first surface and the second surface are oppositely placed along the first direction D1, and the first direction D1 and the first surface are perpendicular;

Step S41, forming a stacked structure on the first surface of the substrate body 10, the stacked structure includes a second storage block R0 and a first storage block R1 above the second storage block R0;

Step S42, forming a first lead 15 located above the packaging substrate and electrically connecting the first storage block R1 and the first pad 11, and forming a first lead 15 passing through the through-hole 36 and electrically connecting the first lead 15, the second lead 16 of the second storage block R0 and the second pad 12. The length of the first lead 15 may be equal to the length of the second lead 16.

In some embodiments, the specific steps of forming the packaging substrate include:

arranging a preset thickness of the stacked structure;
forming the substrate body 10, and making the thickness of the substrate body 10 along the first direction D1 equal to the preset thickness; and
forming the first pad 11 on the first surface of the substrate body 10, the second pad 12 and the third pad 13 on the second surface of the substrate body 10, and a connecting column 14 located in the substrate body 10 and electrically connecting the first pad 11 and the third pad 13.

Specifically, the preset thickness of the subsequent pre-formed stacked structure can be obtained according to the pre-design. Next, the thickness of the substrate body 10 is adjusted according to the preset thickness, so that the thickness of the substrate body 10 is equal to the thickness of the stacked structure to be formed later. Afterwards, a circuit structure is formed on the substrate body 10, and the circuit structure includes the first pad 11 located on the first surface of the substrate body 10, the first solder pad 11 located on the substrate body 10, The second welding pad 12 and the third welding pad 13 on the two surfaces, and the connection column 14 located in the substrate body 10 and electrically connecting the first welding pad 11 and the third welding pad 13. This embodiment is described for the purpose of forming the connecting posts 14 in the substrate body 10. In other specific implementation manners, those skilled in the art may also form a wiring layer inside the substrate body 10 according to actual needs, and connect the first pad 11 and the third pad 13 through the wiring layer.

In some embodiments, the specific steps of forming a stacked structure on the first surface of the substrate body 10 include:

forming a first storage block R1, the first storage block R1 including a plurality of storage chips stacked along the first direction D1, and adjacent storage chips in the first storage block R1 are electrically connected;
forming a second storage block R0, the second storage area R0 consists of a plurality of storage chips stacked along the first direction D1, and adjacent storage chips in the first storage block R1 are electrically connected; and
fixing the second storage block R0 on the first surface of the substrate body 10, and fixing the first storage block R1 above the second storage block R0 along the first direction D1.

In some embodiments, the specific steps of forming the first storage block R1 include:

forming a first storage chip 34 and the second storage chip 24, the top surface of the first storage chip 34 has the first bonding pad 22, and the top surface of the second storage chip 24 has the second bonding pad 20, so the second storage chip 24 further includes a first connecting pad 18 located on the bottom surface of the second storage chip 24, and a first signal plug 19 penetrating through the second storage chip 24 along the first direction D1, so One end of the first signal plug 19 is electrically connected to the second bonding pad 20, and the other end is electrically connected to the first connecting pad 18; and
bonding the first storage chip 34 and the second storage chip 24 in such a manner that the first bonding pad 22 and the second bonding pad 20 face each other.

In some embodiments, the second storage chip 24 further includes a first conductive solder pad 21 located on the surface of the second bonding pad 20 away from the first signal plug 19. The specific steps of bonding the first storage chip 34 and the second storage chip 24 in such a way that the bonding pad 22 is opposite to the second bonding pad 20 include:

bonding the first conductive solder pad 21 and the first bonding pad 22; and
forming a first adhesive layer 25 filling the gap between the first storage chip 34 and the second storage chip 24.

Figure 4:
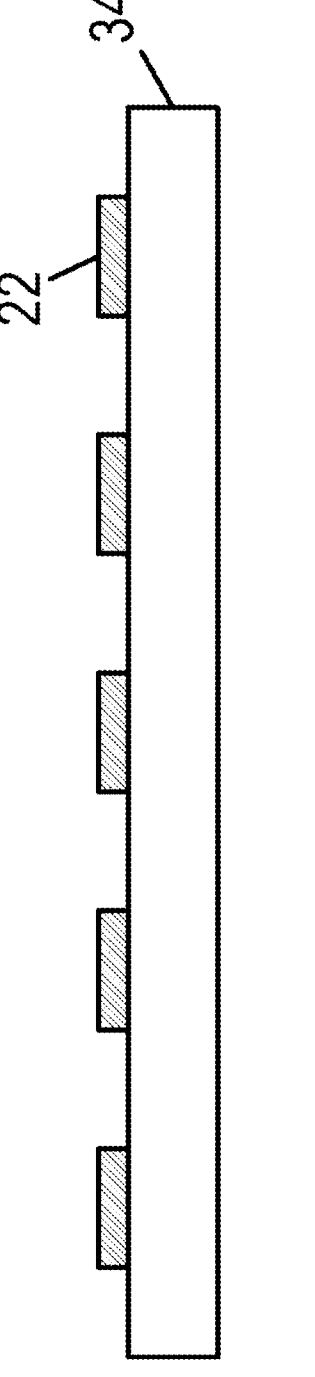
FIGS. 4-10 are structural schematic diagrams during the process of forming the three-dimensional stacked package structure according to the embodiment of the present disclosure.
Figure 5:
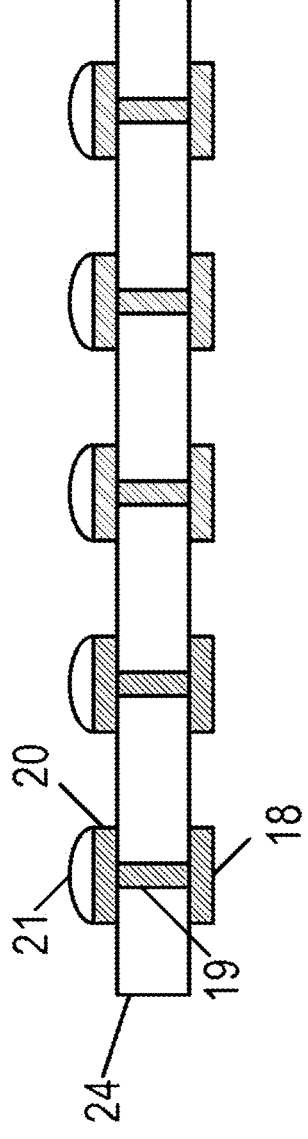

For example, after forming the first storage chip 34 as shown in FIG. 4 and the second storage chip 24 as shown in FIG. 5, bonding the first conductive solder pad 21 and the first bonding pad 22 is used to realize the bonding connection between the first storage chip 34 and the second storage chip 24. Afterwards, an insulating adhesive such as underfill glue is filled between the first storage chip 34 and the second storage chip 24, so as to enhance the bonding between the first storage chip 34 and the second storage chip 24. connection strength. Wherein, the first storage chip 34 and the second storage chip 24 may both be DRAM chips. The materials of the first bonding pad 22, the second bonding pad 20, the first connecting pad 18 and the first signal plug 19 may be the same, for example, NiAu alloy material. The material of the first conductive solder pad 21 may be any one of Cu, Ni, Sn, Ag or an alloy material composed of two or more materials. In one example, the material of the first conductive solder pad 21 is Cu/Ni/Sn/Ag (that is, an alloy material composed of Cu, Ni, Sn and Ag), Cu/Sn/Ag (that is, Cu, Sn and Ag Composed of alloy materials) or Ni/Sn/Ag (that is, alloy materials composed of Ni, Sn and Ag).

Figure 6:
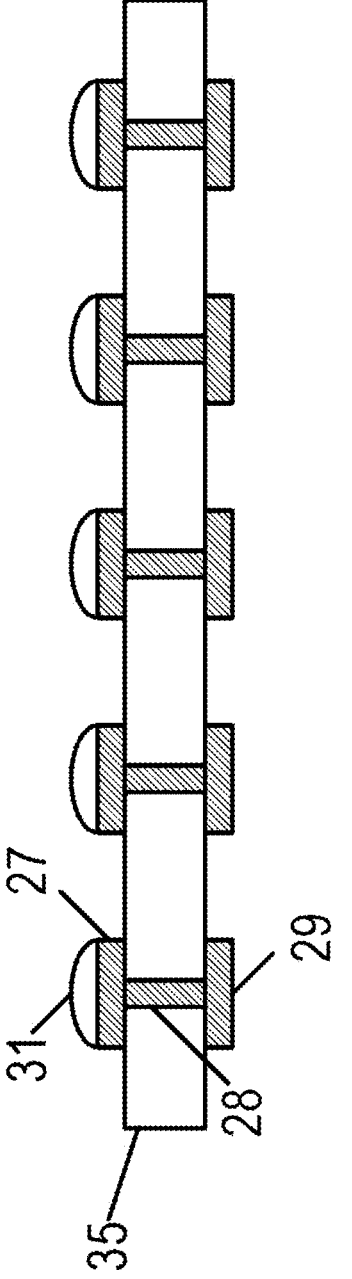
Figure 7:
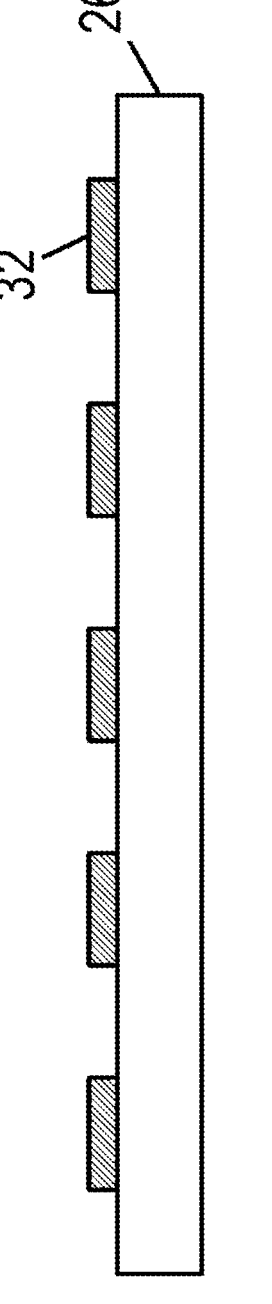

In some embodiments, the specific steps of forming the second storage block R0 include:

Form a third storage chip 35 (as shown in FIG. 6) and a fourth storage chip 26 (as shown in FIG. 7), the top surface of the third storage chip 35 has a third bonding pad 27, and the fourth storage chip The top surface of the chip 26 has a fourth bonding pad 32, the third storage chip 35 also includes a second bonding pad 29 located on the bottom surface of the third storage chip 35, and a second signal plug 28 of the third storage chip 35, one end of the second signal plug 28 is electrically connected to the third bonding pad 27, and the other end is electrically connected to the second bonding pad 29;

The third storage chip 35 and the fourth storage chip 26 are bonded in such a manner that the third bonding pad 27 and the fourth bonding pad 32 are opposite to each other.

In one example, the third storage chip 35 further includes a second conductive solder pad 31 located on the surface of the third bonding pad 27, through which the second conductive solder pad 31 is bonded to the fourth bonding pad. together to connect the third storage chip 35 and the fourth storage chip 26.

In some embodiments, the second storage block R0 is fixed on the first surface of the substrate body 10, and the first storage block R1 is fixed on the first surface along the first direction D1. The specific steps above the second storage block R0 include:

The third storage chip 35 in the second storage block R0 is bonded to the first surface of the substrate body 10 through a second adhesive layer 30, and the second adhesive layer 30 has a groove 301 passing through the second adhesive layer 30 in the first direction D1 and aligned with the through-hole 36 along the first direction D1, at least one of the second bonding pads 29 and the through-hole 36 aligning along the first direction D1;

The first storage chip 34 and the fourth storage chip 26 in the first storage block R1 are bonded through a third bonding layer 33.

Figure 8:
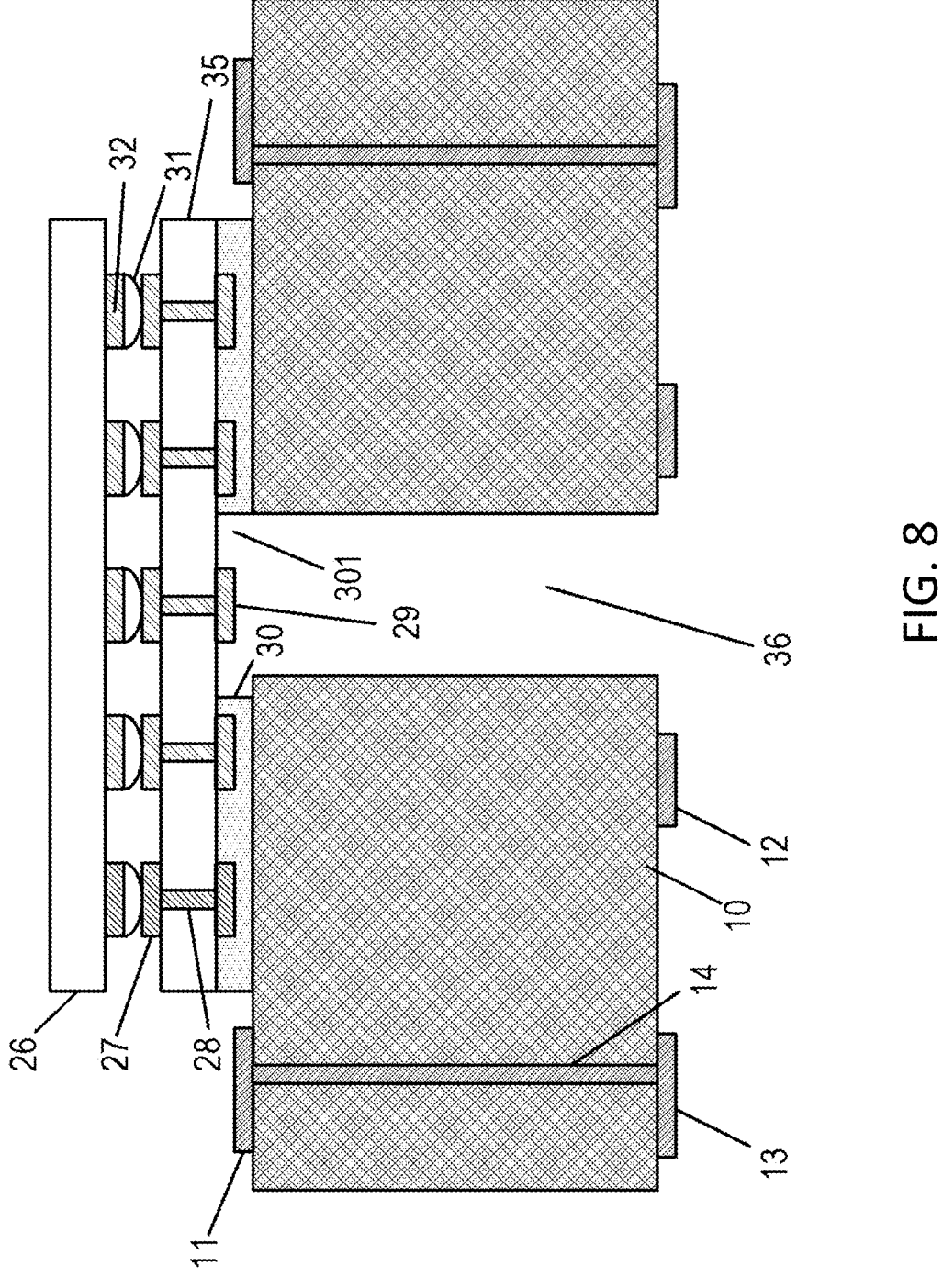
Figure 9:
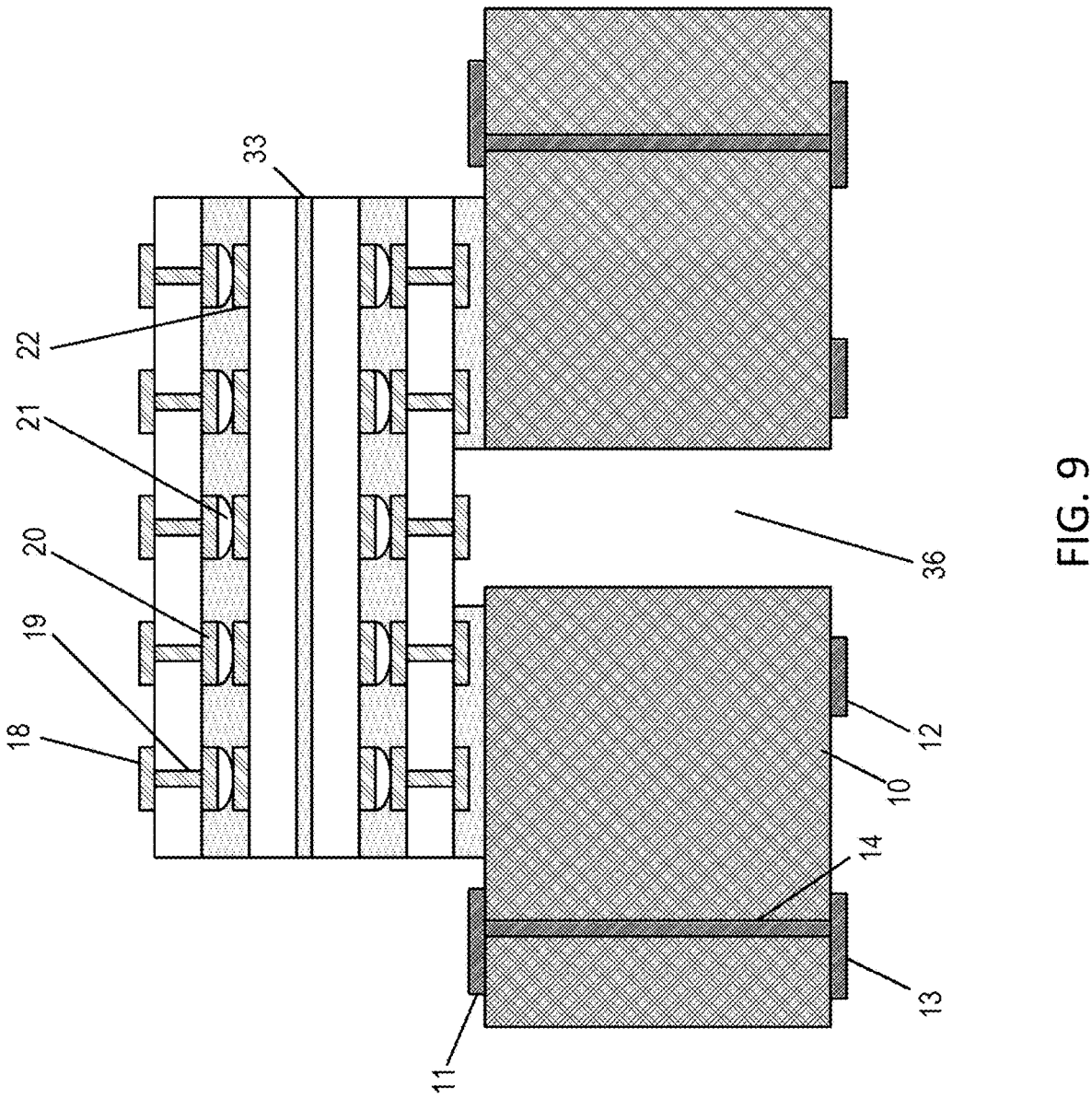

Specifically, the third storage chip 35 is fixed on the first surface of the substrate body 10 of the packaging substrate through the second adhesive layer 30, and the third storage chip 35 The at least one second bonding pad 29 is aligned with the through-hole 36 along the first direction D1. The second adhesive layer 30 has a groove 301 penetrating through the second adhesive layer 30 along the first direction D1, and the groove 301 is aligned with the through-hole 36, at least one of the position of the second bonding pad 29 is aligned with the position of the groove 301, that is, at least one of the second bonding pads 29 is exposed through the groove 301. Afterwards, the second conductive solder pad 31 in the third storage chip 35 is bonded to the fourth bonding pad 32 in the fourth storage chip 26 through a bonding process to form a bonding pad as shown in FIG. 8. Structure. Afterwards, a fourth adhesive layer 37 filling the gap between the third storage chip 35 and the fourth storage chip 26 is formed. Next, the formed first storage block R1 is connected to the bottom surface of the fourth storage chip 26 through the third bonding layer 33 to form a structure as shown in FIG. 9.

In other specific implementation manners, after forming the structure as shown in FIG. The second storage chip 24 is bonded to the first storage chip 34 through a bonding process.

Figure 10:
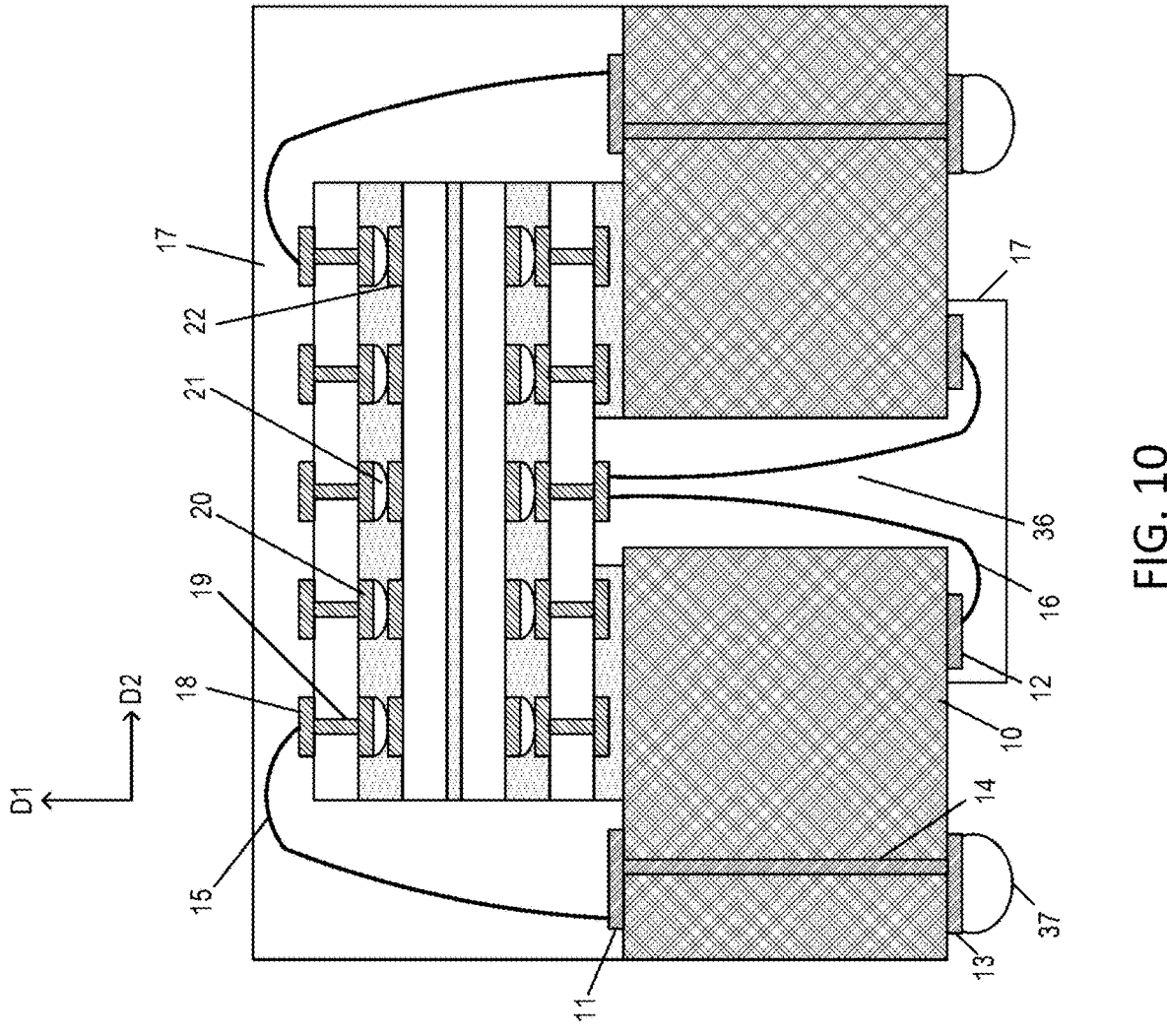

In some embodiments, a first lead 15 located above the package substrate and electrically connected to the first storage block R1 and the first pad 11 is formed, and formed to pass through the through-hole 36 and electrically connected to the specific steps of the second storage block R0 and the second lead 16 of the second pad 12 include:

forming the first lead 15 located above the package substrate and electrically connecting the first connecting pad 18 and the first pad 11;

passing the second lead 16 through the through-hole 36 and the groove 301 and electrically connecting the second bonding pad 29 and the second welding pad 12, as shown in FIG. 10.

After the first lead 15 and the second lead 16 are formed, the plastic encapsulation layer 17 covering at least the stacked structure, the first lead 15 and the second lead 16 may be formed through a plastic encapsulation process. The plastic encapsulation layer 17 fills the through-holes 36 to avoid external factors from affecting the stacked structure, the first leads 15 and the second leads 16. Afterwards, solder balls 37 may also be formed on the surface of the third solder pad 13 to form an LPDDR product.

In some embodiments, the plastic encapsulation layer 17 may include epoxy material and a filler dispersed in the epoxy material, such as silicon dioxide. The fourth adhesive layer 37 may include epoxy resin and a filler dispersed in the epoxy resin, such as silicon dioxide. Since the gap between the third storage chip 26 and the fourth storage chip 35 is small, the fluidity of the fourth adhesive layer 37 can be improved, so as to avoid the gap between the third storage chip 26 and the fourth storage chip 35. The air bubbles, for example, make the filler content in the fourth adhesive layer 37 lower than the filler content in the plastic encapsulation layer 17, thereby improving the filling effect of the fourth adhesive layer 37. Of course, it is also possible to make the volume of the filler in the fourth adhesive layer 37 smaller than the volume of the filler in the plastic encapsulation layer 17. Because the volume of the filler is smaller, the fluidity of the fourth adhesive layer 37 is stronger, thereby improving the performance of the fourth adhesive layer 37. fill effect.

In the three-dimensional stacked package structure and its forming method provided in some embodiments of this embodiment, a through-hole penetrating the packaging substrate along the first direction is formed inside the packaging substrate, so that the second storage block on the packaging substrate passes through the second lead of the through-hole is electrically connected to the packaging substrate, and the first storage block located above the second storage block is electrically connected to the packaging substrate through the first lead located above the packaging substrate, so that the length of the first lead wire is equal to the length of the second lead wire without winding wires inside the first storage block, the second storage block, or the packaging substrate, thereby reducing the cost of different storage blocks. At the same time, it reduces the crosstalk between the leads and other signal lines, thereby improving the yield and performance of the 3D stacked package structure, and will not increase the complexity of the internal circuits of the 3D stacked package structure, thus helping to control the cost of the three-dimensional stack package structure.

The invention claimed is:

1. A three-dimensional stacked package structure, comprising:

a packaging substrate, comprising a substrate body, a through-hole penetrating through the substrate body along a first direction, a first pad disposed on a first surface of the substrate body, and a second pad on a second surface of the substrate body, wherein the first surface and the second surface of the substrate body are oppositely distributed along the first direction, and wherein the first direction is perpendicular to the first surface;

a stacked structure, located on the first surface of the substrate body, wherein the stacked structure comprises a second storage block and a first storage block located above the second storage block; and connecting leads, comprising a first lead and a second lead having equal lengths, wherein the first lead is located above the package substrate, wherein a first end of the first lead is electrically connected to the first pad, and a second end of the first lead is electrically connected to the first storage block, wherein the second lead passes through the through-hole, and wherein a first end of the second lead is electrically connected to the second pad, and a second end of the second lead is electrically connected to the second storage block, wherein the first storage block comprises a first storage chip and a second storage chip which is positioned above the first storage chip along a first direction;

wherein the first storage block further comprises a first bonding layer filled in the gap between the first storage chip and the second storage chip, for bonding the first storage chip and the second storage chip;

wherein the stacked structure further comprises a second adhesive layer located between the second storage block and the packaging substrate;

wherein the first stacked structure further comprises a third adhesive layer located between the first storage block and the second storage block, and thermal expansion coefficient of the second adhesive layer is smaller than thermal expansion coefficient of the third adhesive layer.

2. The three-dimensional stacked package structure according to claim 1, wherein a thickness of the stacked structure along the first direction is equal to a thickness of the substrate body along the first direction.

3. The three-dimensional stacked package structure according to claim 1, wherein the packaging substrate further comprises:

a third pad, located on the second surface of the substrate body; and a connection column, located in the substrate body, wherein a first end of the connection column is electrically connected to the first pad, and a second end of the connection column is electrically connected to the third pad.

4. The three-dimensional stacked package structure according to claim 1, wherein a top surface of the first storage chip is bonded to a top surface of the second storage chip; and wherein a bottom surface of the second storage chip is electrically connected to the first lead.

5. The three-dimensional stacked package structure according to claim 4, wherein the top surface of the first storage chip has a first bonding pad, the top surface of the second storage chip has a second bonding pad, wherein the first bonding pad is electrically connected to the second bonding pad;

wherein the second storage chip further comprises a first connecting pad located on the bottom surface of the second storage chip, wherein a first signal plug penetrates through the second storage chip along the first direction, wherein a first end of the first signal plug is electrically connected to the second bonding pad, a second end of the first signal plug is electrically connected to the first bonding pad, and wherein the first lead is electrically connected to the first bonding pad.

6. The three-dimensional stacked package structure according to claim 5, wherein the first storage chip further comprises:

a first conductive solder pad disposed on a surface of the first bonding pad away from the first signal plug, wherein the first conductive solder pad is bonded to the second bonding pad.

7. The three-dimensional stacked package structure according to claim 1, wherein the second adhesive layer comprises a groove penetrating the second adhesive layer along the first direction, wherein the groove is aligned with the through-hole along the first direction, and wherein the second lead passes through the groove and the through-hole.

8. The three-dimensional stacked package structure according to claim 7, wherein the second storage block comprises:

a plurality of second storage chips, wherein the plurality of second storage chips are stacked along the first direction, and adjacent ones of the plurality of second storage chips are electrically connected, and wherein the second lead is electrically connected to a bottom-most storage chip of the second storage block.

9. The three-dimensional stacked package structure according to claim 8, wherein the second storage block comprises a third storage chip and a fourth storage chip, wherein the fourth storage chip is located above the third storage chip along the first direction, wherein a top surface of the third storage chip is bonded to a top surface of the fourth storage chip; and wherein a bottom surface of the third storage chip is electrically connected to the second lead.

10. The three-dimensional stacked package structure according to claim 9, wherein the top surface of the third storage chip has a third bonding pad, wherein a top surface of the fourth storage chip has a fourth bonding pad, and wherein the third bonding pad is electrically connected to the fourth bonding pad;

wherein the third storage chip further comprises a second bonding pad located on the bottom surface of the third storage chip, and wherein a second signal plug penetrates through the third storage chip along the first direction, wherein a first end of the second signal plug is electrically connected to the third bonding pad, a second end of the second signal plug is electrically connected to the second bonding pad, wherein the second lead is electrically connected to the second bonding pad, and the second bonding pad is aligned to the through-holes along the first direction.

11. The three-dimensional stacked package structure according to claim 9, wherein the three-dimensional stacked package further comprises a plastic encapsulation layer, wherein the plastic encapsulation layer covers at least the stacked structure, the first lead and the second lead.

12. The three-dimensional stacked package structure according to claim 11, wherein the second storage block further comprises a fourth adhesive layer filled in the gap between the third storage chip and the fourth storage chip.

13. The three-dimensional stacked package structure according to claim 12, wherein a volume of filler in the fourth adhesive layer is smaller than a volume of filler in plastic encapsulation layer.

14. The three-dimensional stacked package structure according to claim 12, wherein a filler content in the fourth adhesive layer is lower than a filler content in the plastic encapsulation layer.

\* \* \* \* \*